United States Patent [19]
Ovens et al.

[11] Patent Number: 5,381,455
[45] Date of Patent: Jan. 10, 1995

[54] INTERLEAVED SHIFT REGISTER

[75] Inventors: Kevin Ovens, Plano; Clive Bittlestone; Bob Helmick, both of Allen, all of Tex.

[73] Assignee: Texas Instruments Incorporated, Dallas, Tex.

[21] Appl. No.: 53,941

[22] Filed: Apr. 28, 1993

[51] Int. Cl.$^6$ .............................................. G11C 19/00
[52] U.S. Cl. ....................................... 377/67; 377/75; 377/80
[58] Field of Search .............................. 377/67, 75, 80

[56] References Cited

U.S. PATENT DOCUMENTS

| | | | |
|---|---|---|---|
| 4,672,647 | 6/1987 | Yamaguchi et al. | 377/67 |
| 4,903,285 | 2/1990 | Knierim et al. | 377/67 |
| 5,150,389 | 9/1992 | Kawasaki | 377/67 |
| 5,226,063 | 7/1993 | Higashitsutsumi | 377/23 |

OTHER PUBLICATIONS

Razak Hossain, Leszek D. Wronski and Alexander Albicki; *Low Power Design Using Double Edge Triggered Flip-Flops*; Publication: IEEE Transactions on Very Large Scale Integration (VLSI) Systems; vol. 2, No. 2, Jun. 1994; pp. 261-265.

*Primary Examiner*—Margaret Rose Wambach
*Attorney, Agent, or Firm*—Thomas G. Eschweiler; James C. Kesterson; Richard L. Donaldson

[57] ABSTRACT

An interleaved shift register 20 includes a plurality of data storage elements 22a-22d having a common data input signal. Each of the plurality of data storage elements 22a-22d has an enable control input that is connected to one of a plurality of clock signals, each of the plurality of clock signals being incrementally out of phase with one another. Interleaved shift register 20 provides multiple data bits of the data signal to be stored within a single clock period of one of the plurality of clock signals, thus greatly improving the data rate without increasing the storage rate of the plurality of data storage elements 22a-22d.

7 Claims, 6 Drawing Sheets

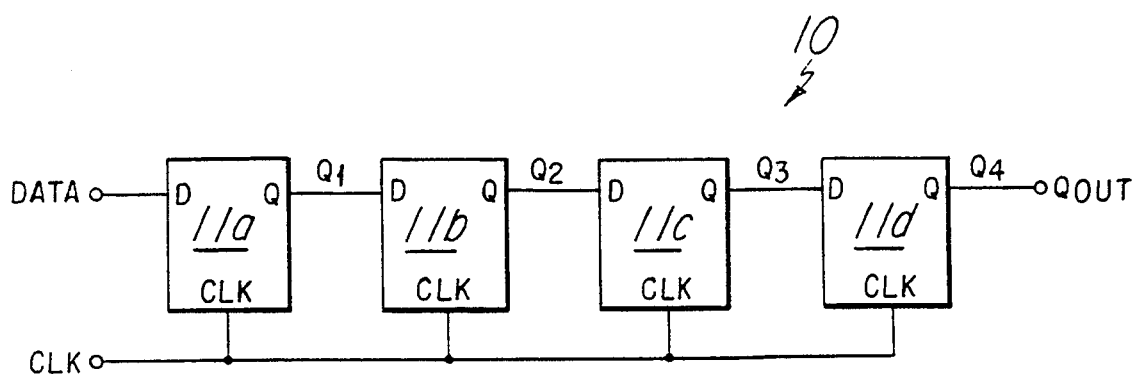
Fig. 1
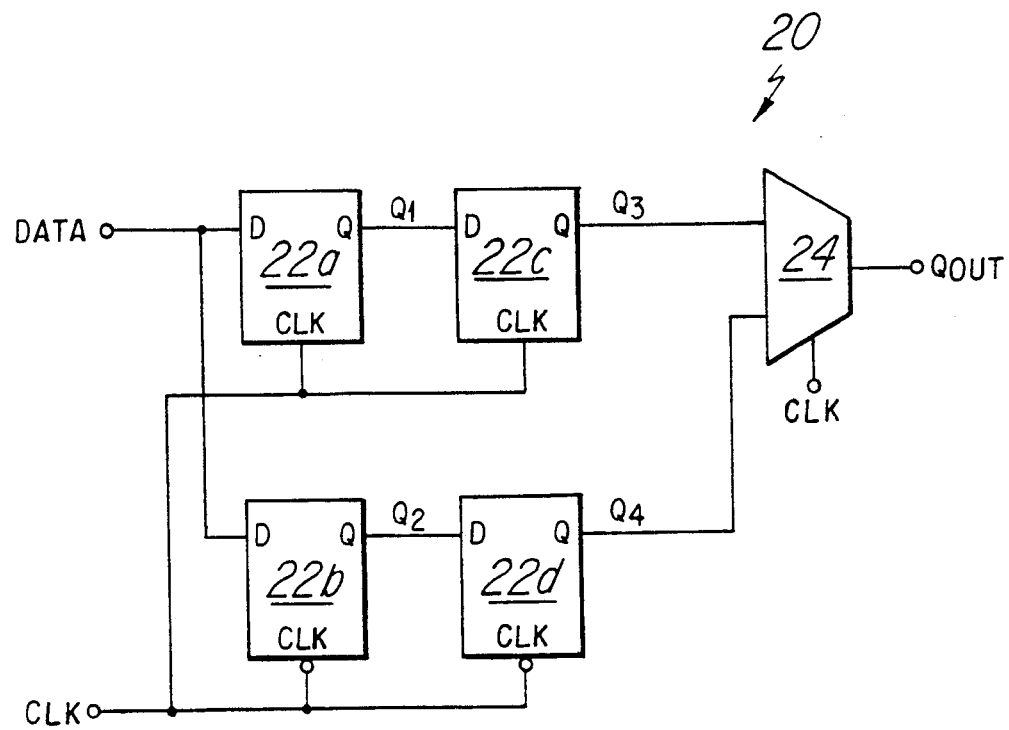
Fig. 2
| DATA PASS CLOCK | $Q_5$ | $Q_6$ | $Q_7$ | $Q_8$ |
|---|---|---|---|---|
| $CLK_1$ | 0 | 1 | 1 | 0 |
| $CLK_2$ | 0 | 1 | 0 | 1 |
Fig. 8

INTERLEAVED SHIFT REGISTER

FIELD OF THE INVENTION

This invention is in the field of electronic circuits and is more particularly related to shift register circuits.

BACKGROUND OF THE INVENTION

In digital circuit design, the shift register is an integral design component and play a role in diverse circuit solutions. A typical prior an shift register 10 is illustrated in FIG. 1. FIG. 1 illustrates a 4-bit serial shift register 10. Shift register 10 includes four D-type flip flops 11a–11d having a data input "D", a clock input "CLK", and an output "Q". The output "Q" of each flip flop forms the "D" input for the next subsequent flip flop. A clock signal CLK is physically connected to each flip flop 11a–11d. Each flip flop 11a–11d are positive edge triggered flip flops which means that data is shifted from input "D" to output "Q" on the positive edge of clock signal CLK. Shift register 10 operates in the following manner: when clock signal CLK transitions from a low logic level to a high logic level the logic level of the data signal is transferred and latched to the output "$Q_1$" of flip flop 11a. At this time, the logic values of outputs $Q_2$, $Q_3$, and $Q_4$ are unknown. On the next positive edge of CLK, $Q_1$ (which is data input "D" of flip flop 11 b) is transferred and latched to output $Q_2$. In a similar manner, on each subsequent positive edge of CLK, data is shifted through the next subsequent flip flop. Shift register 10 suffers from a fundamental performance trade-off: data rate transfer speed and power consumption. Designers wish to maximize data rate transfer speed while simultaneously minimizing power consumption. In shift register 10, the speed of shifting a data bit from one flip flop to another is dictated by the frequency of clock signal CLK. As the frequency of CLK is increased the data rate transfer speed of shift register 10 increases. However, as the data rate transfer speed of shift register 10 increases, each flip flop 11a–11d is operating at a higher frequency and thus consuming more power. Further, as the frequency of CLK is increased eventually the designer becomes limited by the frequency limitation of flip flops 11a–11d. Therefore it is obvious that a solution is needed that allows shift registers to exhibit higher data rate transfer speeds without appreciably increasing the circuit's power consumption.

It is an object of this invention to provide a shift register that allows an increase in operating speed without an appreciable increase in power consumption. It is another object of the invention to provide a shift register that provides the same data rate transfer speed performance as prior art shift register 10, yet consumes considerably less power. Other objects and advantages of the invention will become apparent to those of ordinary skill in the art having reference to the following specification together with the drawings herein.

SUMMARY OF THE INVENTION

An interleaved shift register includes a plurality of data storage elements having a common data input signal. Each of the plurality of data storage elements has an enable control input that is connected to one of a plurality of clock signals, each of the plurality of clock signals being incrementally out of phase with one another. The interleaved shift register provides multiple data bits of the data signal to be stored within a single clock period of one of the plurality of clock signals, thus greatly improving the data rate without increasing the storage rate of the plurality of data storage elements.

BRIEF DESCRIPTION OF THE DRAWINGS

FIG. 1 is a prior art schematic diagram of a 4-bit shift register.

FIG. 2 is a schematic diagram illustrating the preferred embodiment of the invention, an interleaved shift register.

FIG. 8 is a diagram illustrating the decode technique of the multiplexer of FIG. 6.

DETAILED DESCRIPTION OF THE PREFERRED EMBODIMENT

Figure 3:
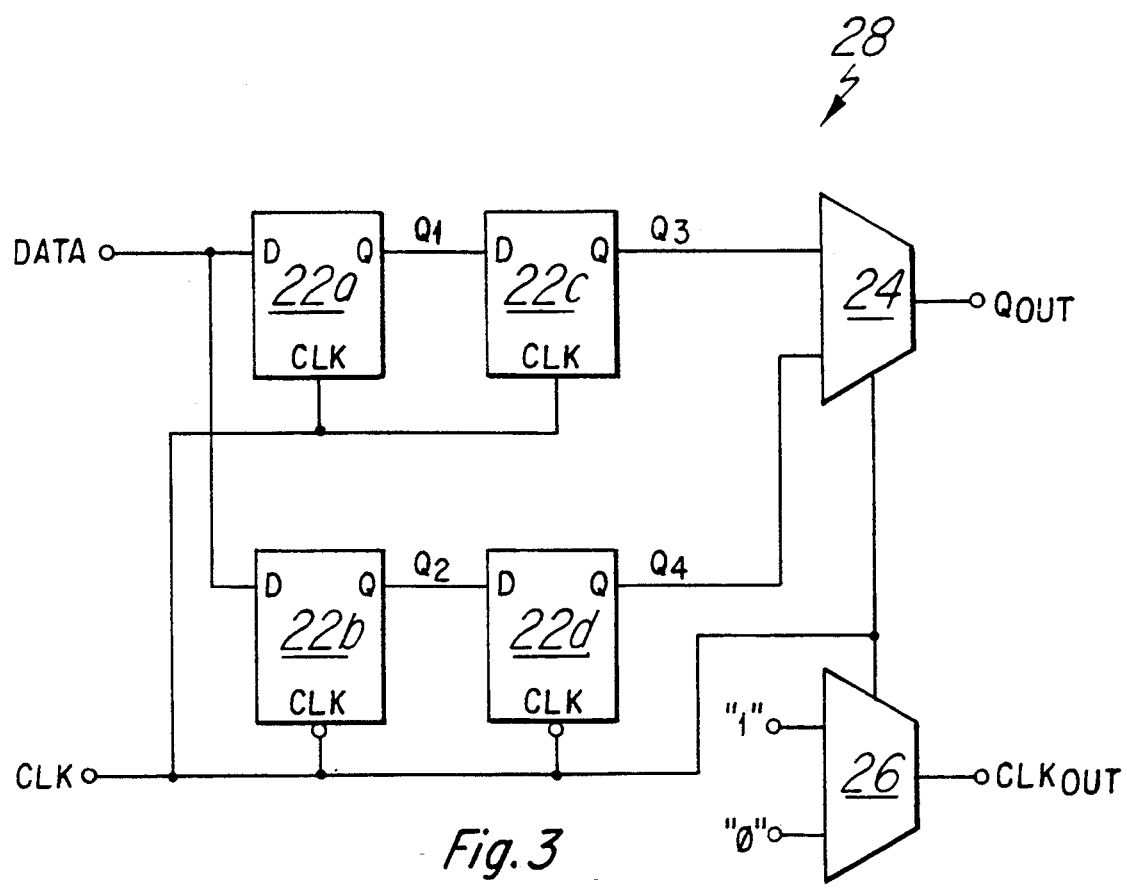
FIG. 3 is a schematic diagram illustrating an alternative embodiment of the invention, an interleaved shift register.

FIG. 2 is a schematic diagram illustrating the preferred embodiment of the invention, an interleaved shift register 20. Shift register 20 is composed of two sets of two D-type flip flops 22a–22d connected in parallel. Although D-type flip flops are used in this embodiment, it is understood that other types of data storage elements may also be used such as latches or capacitors. An output of flip flop 22c ($Q_3$) and an output of flip flop 22d ($Q_4$) form inputs to a multiplexer 24. The output of multiplexer 24 forms the output $Q_{out}$ of shift register 20. Input data signal DATA is connected to the data inputs "D" of flip flops 22a and 22b. The data input "D" of flip flop 22c is connected to the output "$Q_1$" of flip flop 22a and the data input "D" of flip flop 22d is connected to the output "$Q_2$" of flip flop 22b. Flip flops 22a and 22c are positive edge triggered flip flops while flip flops 22b and 22d are negative edge triggered flip flops. Flip flops 22a–22d are all connected to clock signal CLK.

FIG.3 is a schematic diagram illustrating an alternative embodiment of the invention, an interleaved shift register 28. FIG. 3 is similar to FIG. 2 in the connecting of flip flops 22a–22d and the connections between flip flops 22c and 22d to multiplexer 24. Shift register 28 differs from shift register 20 of FIG. 2 in that a second multiplexer 26 has two fixed binary inputs, a "0" and a "1", and is controlled by clock signal CLK which also controls multiplexer 24. Multiplexer 26 takes clock signal CLK and passes it to multiplexer 26 output "$CLK_{out}$" with the propagation delay as DATA experiences through multiplexer 24 so that outputs $Q_{out}$ and $CLK_{out}$ are synchronized. This allows a user to utilize $CLK_{out}$ to accurately identify the various bits of data on $Q_{out}$ when the duty cycle of CLK is not 50%.

Figure 4:
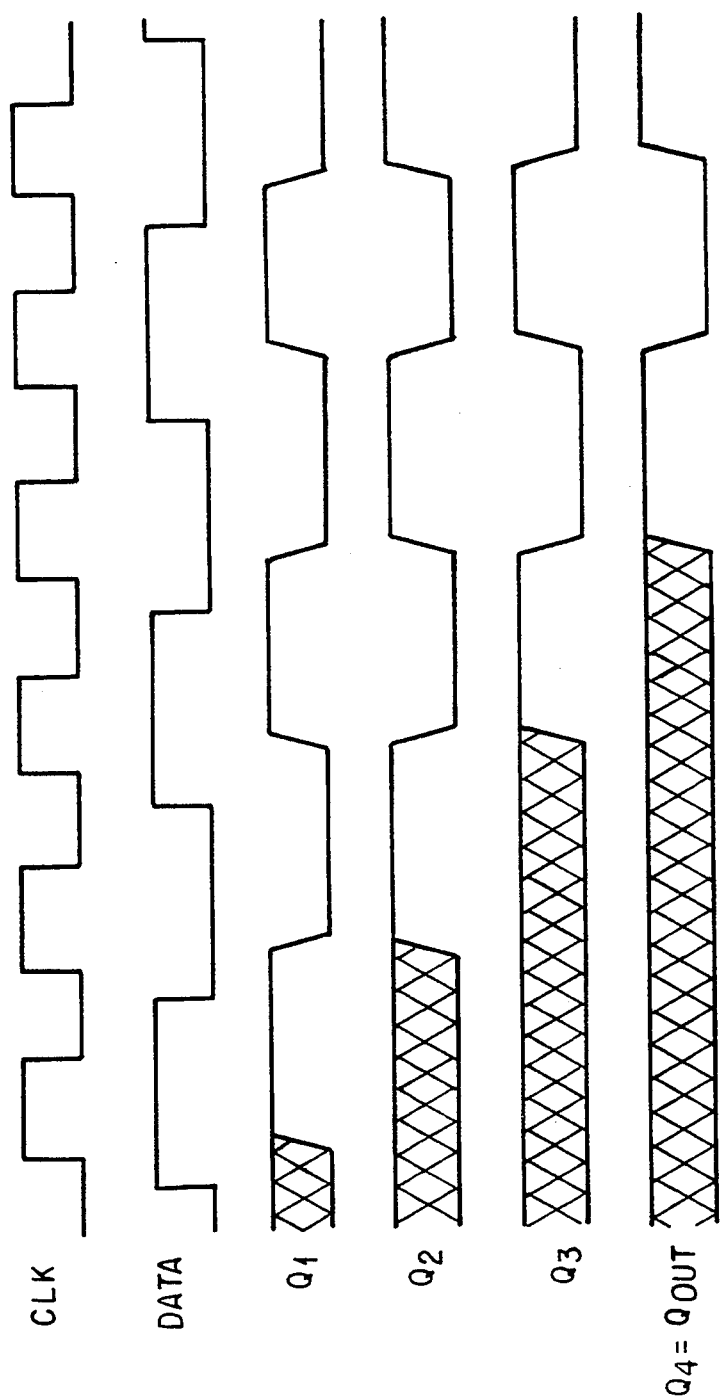
FIG. 4 is a timing diagram illustrating the switching characteristics of the prior art shift register of FIG. 1.
Figure 5:
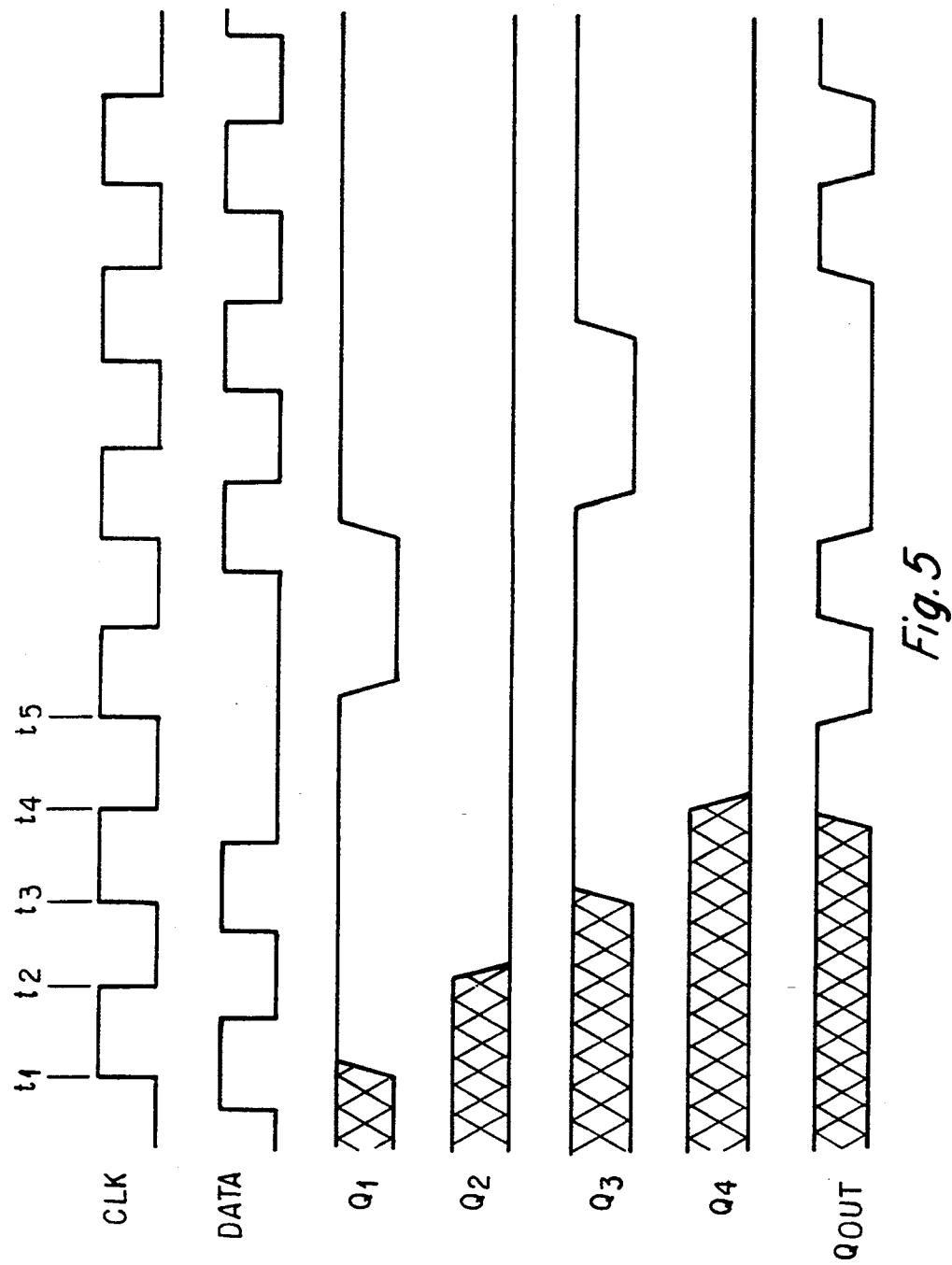
FIG. 5 is a timing diagram illustrating the switching characteristics of the preferred embodiment of the invention illustrated in FIG. 2.

FIG. 4 is a timing diagram illustrating the switching characteristics of prior art shift register 10 of FIG. 1. FIG. 5 is a timing diagram illustrating the switching characteristics of shift register 20 of FIG. 2 or shift register 28 of FIG. 3.

Figure 6:
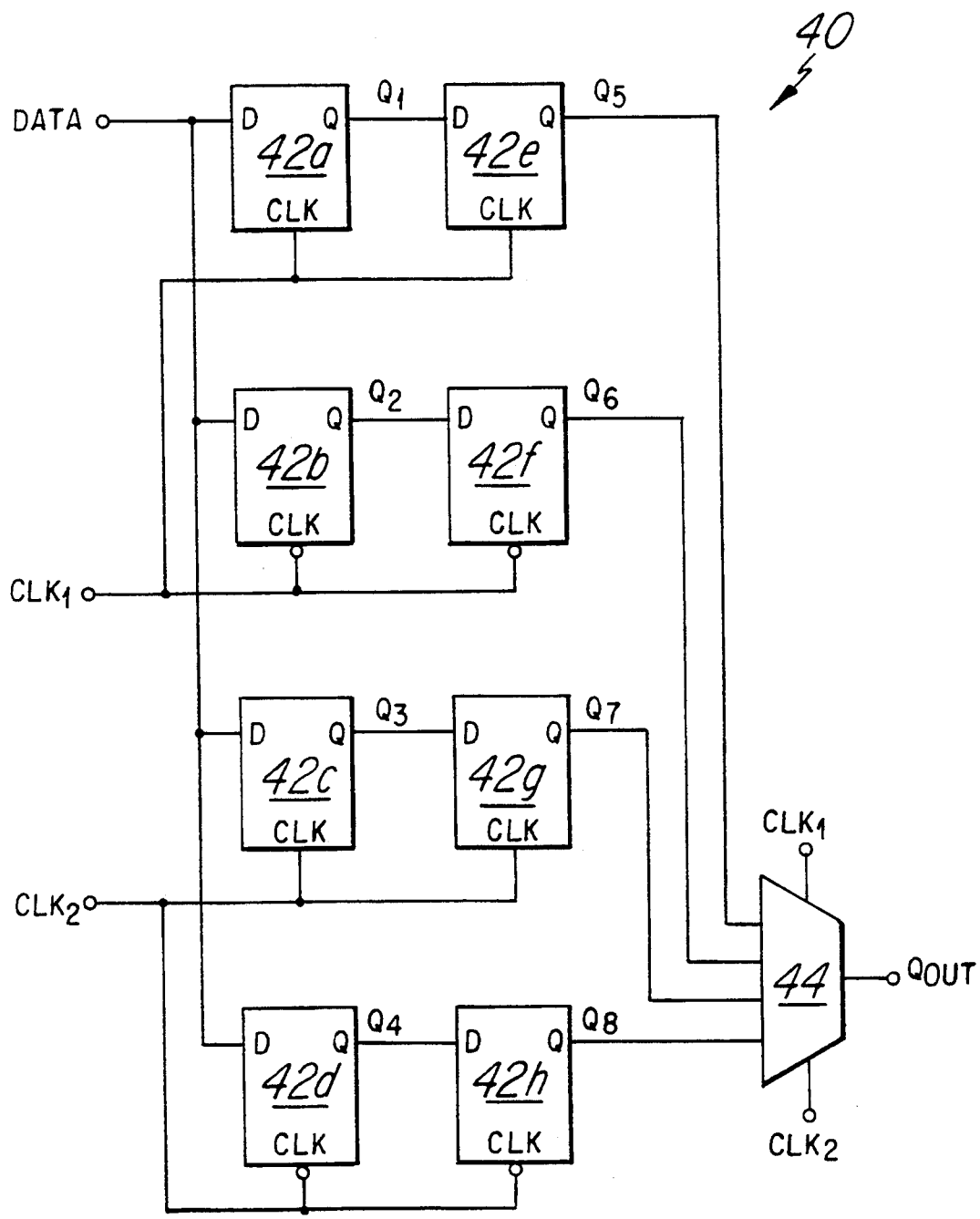
FIG. 6 is a schematic diagram illustrating another alternative embodiment of the invention.

FIG. 6 is a schematic diagram illustrating a four level interleaved shift register 40. Shift register 40 consists of two shift registers as shown in FIG. 2 further interleaved together. A four-to-one multiplexer 44 receives the outputs of flip flops 42e, 42f, 42g, and 42h and clock signals CLK$_1$ and CLK$_2$ and has an output Q$_{out}$. A first clock signal CLK$_1$ drives flip flops 42a, 42b, 42e, and 42f while a second clock signal CLK$_2$ drives flip flops 42c, 42d, 42g, and 42h. Flip flops 42a, 42c, 42e, and 42g switch data from their inputs to their outputs on the positive edge of their respective clock signals while flip slops 42b, 42d, 42f, and 42h switch data on the negative edge of their respective clock signals. Clock signal CLK$_2$ is ninety degrees out of phase with clock signal CLK$_1$. Therefore, within a single period of clock signal CLK$_1$, four data bits may be shifted through shift register 40 output Q$_{out}$ as opposed to one data bit per clock period with prior art shift register 10.

Figure 7:
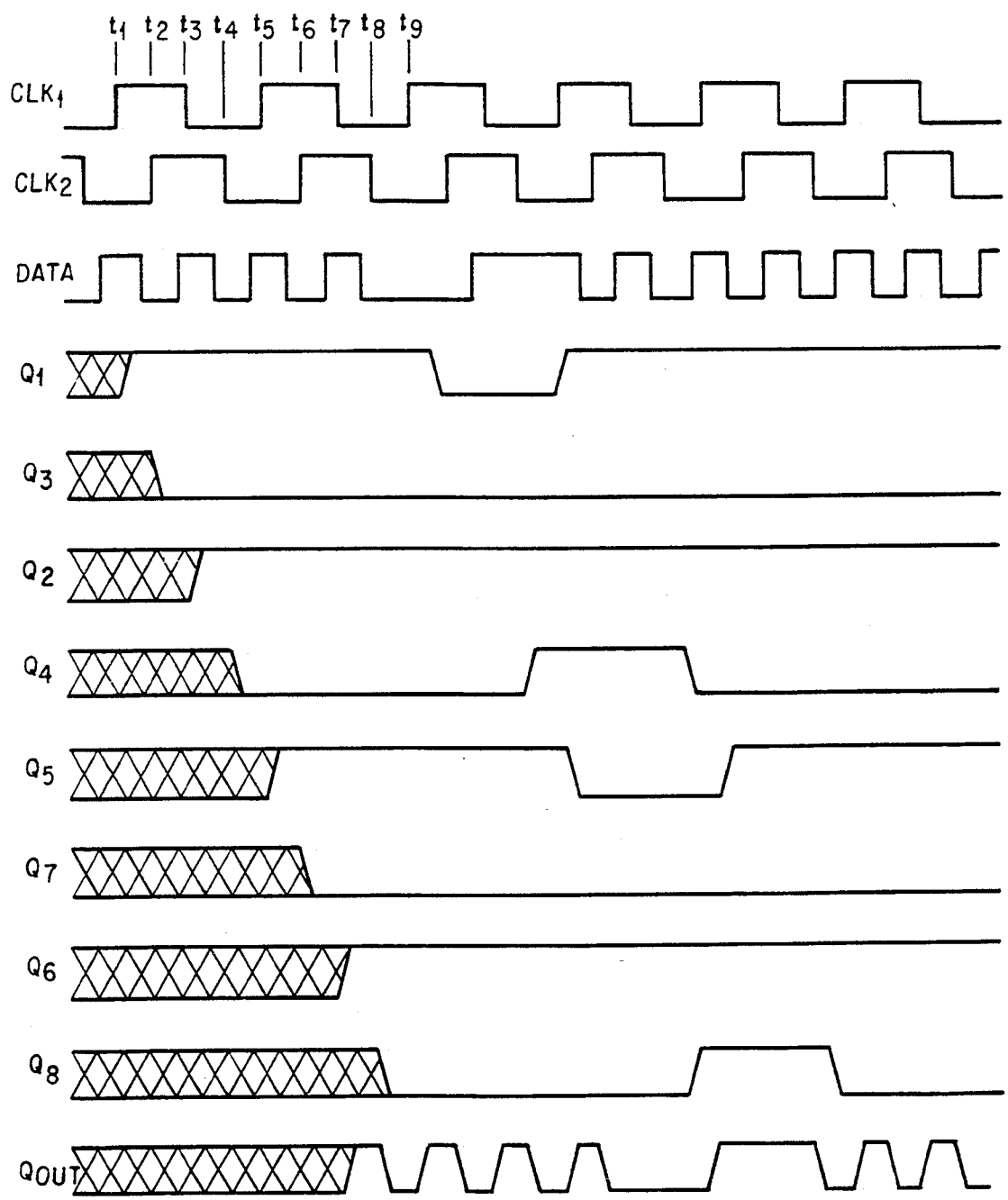
FIG. 7 is a timing diagram illustrating the switching characteristics of another alternative embodiment of the invention of FIG. 6.

FIG. 7 is a timing diagram illustrating the switching characteristics of shift register 40 of FIG. 6. FIG. 8 is a chart that illustrates the decoding technique of multiplexer 44 of FIG. 6.

The functional description of shift register 20 will now be described with reference to the timing diagram of FIG. 5. In FIG. 2, data is clocked from inputs "D" of flip flops 22a and 22c onto their outputs Q$_1$ and Q$_3$ on the rising edge of CLK. Further, data is clocked from data inputs "D" of flip flops 22b and 22d onto their outputs Q$_2$ and Q$_4$ on the falling edge of CLK. At time t$_1$ both flip flop 22a and 22c latch the data on their inputs "D" to their outputs Q$_1$ and Q$_3$. Since the data at Q$_1$ at time t$_1$ is not known output Q$_3$ in not known. Since DATA at time t$_1$ is a "1" Q$_1$ is a "1". The slight delay between t$_1$ and Q$_1$ is the propagation delay through flip flop 22a. The known value of Q$_1$ will not be clocked through flip flop 22c until the next rising edge of CLK. At time t$_2$ the falling edge of CLK occurs and data is clocked from inputs "D" of flip flops 22b and 22d onto their outputs Q$_2$ and Q$_4$. Since the data on Q$_2$ is not known at time t$_2$ output Q$_4$ is not known. The value of DATA at time t$_2$ is a "0" so Q$_2$ is a "0". At time t$_3$ the rising edge of CLK again occurs and flip flop 22c latches on its output (Q$_3$) the value at input (Q$_1$); therefore Q$_3$ becomes a "1". Flip flop 22a latches the value of DATA onto its output Q$_1$ at time t$_3$. Since the value at DATA at time t$_3$ is a "1", Q$_1$ is a "1". At time t$_4$ the falling edge of CLK again occurs and both flip flop 22b and flip flop 22d latch the data at their inputs. At time t$_4$ the value of the data at input of flip flop 22d is the value of Q$_2$ which is a "0". Therefore flip flop 22d latches a "0" onto output Q$_4$. At time t$_4$ the value of DATA is latched to output Q$_2$ of flip flop 22b. DATA is a "0" at time t$_4$, therefore Q$_2$ is a "0". Flip flops 22a–22d continue to latch data on the positive and negative edges of CLK respectively.

Accurate data is reconstructed in shift register 20 via multiplexer 24. Although a multiplexer is utilized in the preferred embodiment to reconstruct DATA, it is understood that other methods may be employed such as a boolean multiplexer or three-state gates. Multiplexer 24 takes outputs Q$_3$ and Q$_4$ of flip flops 22c and 22d and selectively passes them to its output Q$_{out}$. Multiplexer 24 selectively passes data from Q$_3$ and Q$_4$ to Q$_{out}$ in the following manner. At time t$_3$, Q$_3$ becomes a "1", to ensure that Q$_3$ is stable multiplexer 24 does not pass data from Q$_3$ to output Q$_{out}$ until t$_4$. At time t$_4$ data on Q$_3$ has had a half period of CLK to become stable. This ensures that data on Q$_{out}$ is accurate. Similarly, at time t$_4$, Q$_4$ becomes a "0". To ensure that Q$_4$ is stable multiplexer 24 does not pass data from Q$_4$ to output Q$_{out}$ until t$_5$. Thus multiplexer 24 passes data from Q$_3$ to Q$_{out}$ on the falling edge of CLK and passes data from Q$_4$ to Q$_{out}$ on the rising edge of CLK.

A primary advantage of shift register 20 over prior art shift register 10 is that data is latched twice per clock period instead of once per clock period. Shift register 20 therefore provides a data rate increase of 2× over prior art shift register 10. Further, shift register 20 is able to latch data at twice the rate of shift register 10 without flip flops 22a–22d switching at a faster rate, therefore power consumption is not appreciably increased. Flip flops 22a–22d each switch only one time per clock period. Therefore, the data rate of shift register 20 is 2× the data rate of prior art shift register 10 without an appreciable increase in power consumption. There will be a small increase in power consumption due to multiplexer 24 and the higher data rate gate switching, however this increase is not significant. In addition, instead of increasing the data rate speed, one may use shift register 20 to run at the same data rate of prior art shift register 10 while running each flip flop 22a–22d at half the frequency. In this manner, one maintains the same speed performance as prior art while cutting the power consumption almost in half. These are both significant advantages over prior art shift register 10.

Shift register 28 of FIG. 3 differs from shift register 20 of FIG. 2 due to an additional multiplexer 26 that is controlled by CLK similar to multiplexer 24. However, each input of multiplexer 26 is tied to a fixed voltage value. A first input is tied to a "1" and a second input is tied to a "0". Multiplexer 26 provides the same voltage waveform as CLK on its output CLK$_{out}$, however, CLK$_{out}$ is delayed by the same signal propagation as data from Q$_3$ and Q$_4$ being passed through multiplexer 24. Therefore, multiplexer 26 maintains the phase relationship between DATA and CLK at Q$_{out}$ and CLK$_{out}$. This is typically not of great concern, however, when the duty cycle of CLK is not 50%, maintaining the appropriate phase relationship between DATA and CLK at Q$_{out}$ and CLK$_{out}$ becomes extremely important so that CLK$_{out}$ may be used to accurately identify the data.

FIG. 6 illustrates an additional level of interleaving. Shift register 40 has two interleaved shift registers interleaved together. Shift register 40 will be described in conjunction with the timing diagram of FIG. 7 and operates in the following manner. At time t$_1$ the rising edge of CLK$_1$ occurs, thus flip flops 42a and 42e latch the data on their inputs "D" to their outputs Q$_1$ and Q$_5$. Since the input of flip flop 42e was unknown prior to t$_1$ the output Q$_5$ at t$_1$ is also unknown. Since DATA at t$_1$ is a "1" Q$_1$ becomes a "1". At time t$_2$ the rising edge of CLK$_2$ occurs, thus flip flops 42c and 42g latch their data on their inputs "D" to their outputs Q$_3$ and Q$_7$. Since the input of flip flop 42g was unknown prior to t$_2$ the output Q$_7$ at t$_2$ is also unknown. Since DATA at t$_2$ is a "0" Q$_3$ becomes a "0". At time t$_3$ the falling edge of CLK$_1$ occurs, thus flip flops 42b and 42f latch their data on their inputs "D" to their outputs Q$_2$ and Q$_6$. Since the input of flip flop 42f was unknown prior to t$_3$ the output Q$_6$ at t$_3$ is also unknown. Since DATA at t$_3$ is a "1" Q$_2$ becomes a "1". At time t$_4$ the falling edge of CLK$_2$ occurs, thus flip flops 42d and 42h latch the data on their inputs "D" to their outputs Q$_4$ and Q$_8$. Since the input of flip flop 42h was unknown at t$_4$ the output Q$_8$ is also unknown. Since DATA at t$_4$ is a "0" Q$_4$ becomes a "0".

At $t_5$, $CLK_1$ has completed a single, complete signal period since $t_1$ and four bits of DATA have been latched. This is a 4× data rate increase over prior art shift register 10 of FIG. 1.

At time $t_5$ the rising edge of $CLK_1$ occurs and flip flops 42a and 42e again latch the data on their inputs "D" to their outputs $Q_1$ and $Q_5$. This time, since $Q_1$ was established at $t_1$, $Q_5$ will be known and will be a "1". $Q_1$ becomes the value of DATA at $t_5$ which is also a "1". Similarly, at times $t_6$, $t_7$, and $t_8$ the remaining flip flops will also latch their respective data. A fundamental difference between shift register 40 and shift register 20 of FIG. 2 is multiplexer 44. Multiplexer 44 has four data inputs ($Q_5$, $Q_6$, $Q_7$, and $Q_8$) and two control inputs ($CLK_1$ and $CLK_2$). Multiplexer 44 employs a decode technique, one example of which is illustrated in FIG. 8 to pass the appropriate data from $Q_5$, $Q_6$, $Q_7$, and $Q_8$ to $Q_{out}$. FIG. 8 shows that the binary configuration of $CLK_1 = $ "0" and $CLK_2 = $ "1" means that data on $Q_8$ is passed to $Q_{out}$, the binary configuration of $CLK_1 = $ "1" and $CLK_2 = $ "0" means that data on $Q_7$ is passed to $Q_{out}$. The decode technique of FIG. 8 accurately reconfigures DATA with a small delay to ensure that the data on $Q_5$, $Q_6$, $Q_7$, and $Q_8$ are all stable before being passed to $Q_{out}$, similar to multiplexer 24 of FIG. 2.

Shift register 40 of FIG. 6 may provide a 4× increase in data rate over prior art shift register 10 without a significant increase in power consumption or may operate at the same data rate at shift register 10 while reducing the power consumption by approximately 75%. Shift register 40 accomplishes this because for any given data rate flip flops 42a–42h need only operate at one-fourth the frequency of flip flops in shift register 10.

"N" levels of interleaving can be obtained using the above shift register circuit methodology. For an eighth level of interleaving four clocks would be needed with the clocks appropriately out of phase such that eight bits of data could be passed in a single clock period. Further, a more complex multiplexer or appropriate decoder would be needed to appropriately decode the four clock signals so that the data may be accurately reconfigured.

It should also be understood that this invention is not limited to a serial data input, serial data output shift register configuration. Interleaving a shift register as described in FIGS. 2 and 6 with a serial data input and a parallel data output and with a parallel data input and a serial data output is understood to fall within the scope of this invention.

The preferred embodiment of the invention, shift register 20, provides improved data rate performance over prior art without significant increases in power consumption. Alternatively, shift register 20 may provide the equivalent data rate performance of prior art while substantially reducing power consumption.

Although the invention has been described with reference to the embodiments herein, this description is not to be construed in a limiting sense. Various modifications of the disclosed embodiments will become apparent to persons skilled in the art upon reference to the description of the invention. It is therefore contemplated that the appended claims will cover any such modifications or embodiments as fall within the true scope of the invention.

What is claimed is:

1. An interleaved shift register, comprising:
    a first plurality of data storage elements, each of the plurality of data storage elements having a data input connected to a data signal and a storage enable input connected to one of a plurality of clock signals each of the plurality of clock signals being out of phase with each other, and an output, wherein a first portion of the plurality of data storage elements are enabled on the positive edge of their clock signals and a second portion of the plurality of data storage elements are enabled on the negative edge of their clock signals such that a plurality of bits of the data signal are stored in the plurality of data storage elements within one period of one of the plurality of clock signals thus increasing the data rate of the shift register without increasing the storage rate of the plurality of data storage elements.

2. The shift register of claim 1 further comprising:
    a multiplexer having a plurality of inputs connected to the outputs of the first plurality of data storage elements and a plurality of control inputs connected to the plurality of clock signals, wherein the clock signals are used to determine which of the data on the plurality of inputs should be passed to the output.

3. The shift register of claim 1 further comprising:
    a second plurality of data storage elements connected in parallel with the first plurality of data storage elements such that the outputs of the first plurality of data storage elements form inputs to the second plurality of data storage elements and wherein the second plurality of data storage elements increase the capacity of the shift register to 2*N bits where N is equal to the number of data storage elements in the first plurality of data storage elements.

4. An interleaved shift register, comprising:
    a first flip flop having a data input, an enable input, and an output, the data input flip connected to a data signal and the enable input connected to a clock signal, wherein the first flop is enabled on a rising edge of the clock signal;
    a second flip flop having a data input, an enable input, and an output, the data input connected to the data signal and the enable input connected to the clock signal, wherein the second flip flop is enabled on a falling edge of the clock signal;
    a third flip flop having a data input, an enable input, and an output, the data input connected to the output of the first flip flop and the enable input connected to the clock signal, wherein the third flip flop is enabled on the rising edge of the clock signal;
    a fourth flip flop having a data input, an enable input, and an output, the data input connected to the output of the second flip flop and the enable input connected to the clock signal, wherein the fourth flip flop is enabled on the falling edge of the clock signal;
    a first multiplexer having a first input, a second input, a control input, and an output, the first input connected to the output of the third flip flop, the second input connected to the output of the fourth flip flop, and the control input connected to the clock signal; and
    operable to pass two bits of the data signal per clock period to an output of the shift register without increasing the rate of data transfer of the flip flops thereby increasing the data rate of the shift register without substantially increasing the power consumption of the shift register.

5. The shift register of claim 4 further comprising:
a second multiplexer having a first input, a second input, a control input, and an output, the first input connected to a high voltage value, the second input connected to a low voltage value, and the control input connected to the clock signal; and
operable to provide a reproduction of the clock signal with a propagation delay equal to the propagation delay of data through the first multiplexer such that the output of the first multiplexer is synchronized with the output of the second multiplexer.

6. A method of increasing a data rate of a shift register without a substantial increase in power consumption, comprising the steps of:
latching a first data bit into a first data storage element on a rising edge of a first enable signal;
latching a second data bit into a second data storage element on a falling edge of the first enable signal; and
decoding an output of the first data storage element and an output of the second data storage element such that the appropriate order of the two data bits are maintained, wherein two data bits are latched in one period of the first enable signal without the first data storage element or the second data storage element latching each data bit at a frequency greater than the first enable frequency.

7. The method of claim 6 further comprising the steps of:
latching a third data bit into a third data storage element on a rising edge of a second enable signal, wherein the second enable signal is ninety degrees out of phase with the first enable signal;
latching a fourth data bit into a fourth data storage element on a falling edge of the second enable signal;
decoding an output of the third data storage element and an output of the fourth data storage element such that the appropriate order of the two data bits are maintained; and
decoding the outputs of the first and second data storage elements with the outputs of the third and fourth data storage elements, wherein the four data bits are latched in one period of the first enable signal without the four data storage elements latching each data bit at a frequency greater than the first enable frequency.

* * * * *